United States Patent [19]

Mostafazadeh et al.

[11] Patent Number: 5,705,851

[45] Date of Patent: *Jan. 6, 1998

[54] THERMAL BALL LEAD INTEGRATED PACKAGE

[75] Inventors: Shahram Mostafazadeh; Satya Chillara, both of San Jose; Jagdish G. Belani, Cupertino, all of Calif.

[73] Assignee: National Semiconductor Corporation, Santa Clara, Calif.

[*] Notice: The term of this patent shall not extend beyond the expiration date of Pat. No. 5,442,230.

[21] Appl. No.: 496,043

[22] Filed: Jun. 28, 1995

[51] Int. Cl.$^6$ .......................... H01L 23/495; H01L 23/10; H01L 23/34; H01L 23/48

[52] U.S. Cl. .......................... 257/675; 257/707; 257/784; 257/796

[58] Field of Search .................. 257/675, 707, 257/784, 797

[56] References Cited

U.S. PATENT DOCUMENTS

| | | | |
|---|---|---|---|
| 5,216,278 | 6/1993 | Lin et al. | 252/688 |
| 5,216,283 | 6/1993 | Lin | 257/717 |
| 5,311,060 | 5/1994 | Rostoker et al. | 257/796 |
| 5,442,230 | 8/1995 | Chillara et al. | 257/666 |
| 5,468,999 | 11/1995 | Lin et al. | 257/784 |

FOREIGN PATENT DOCUMENTS

| | | | |
|---|---|---|---|
| 0484180-A1 | 5/1992 | European Pat. Off. | 257/712 |
| 19500422 | 7/1995 | Germany . | |
| 63-240053A | 10/1988 | Japan | 257/707 |
| 2181956 | 7/1990 | Japan . | |
| 4-207061A | 7/1992 | Japan | 257/717 |
| 5-47967A | 2/1993 | Japan | 257/707 |
| 5-335438A | 12/1993 | Japan | 257/797 |
| 6-132425A | 5/1994 | Japan | 257/706 |

*Primary Examiner*—Carl W. Whitehead
*Assistant Examiner*—T. M. Arroyo
*Attorney, Agent, or Firm*—Hickman Beyer & Weaver, LLP

[57] ABSTRACT

A Thermal Ball Lead Integrated Package (Thermal BLIP) having improved thermal performance over prior art BLIPs is described. The BLIP combines ball and lead technologies to increase the interconnect density of the package but has relatively poor heat extraction capabilities. The Thermal BLIP is particularly well suited for high power and pin count integrated circuit devices. In an embodiment of the present invention, a heat sink is attached to the top surface of the die and extends through the package molding such that it is exposed to the ambient environment. Since the heat sink is integrated into the molding, the package size and footprint is not increased thereby limiting the cost increase of the package. This arrangement enables the use of high power devices in dense circuit board applications.

11 Claims, 3 Drawing Sheets

5,705,851

THERMAL BALL LEAD INTEGRATED PACKAGE

BACKGROUND OF THE INVENTION

This invention relates generally to an integrated circuit package. More particularly, it relates to a method of removing heat in a Ball Lead Integrated Package.

As technology advances, the complexity, functionality and speed of integrated circuit (IC) chips is steadily increasing. Increasingly complex, high speed IC chips often leads to higher power consumption which means more heat is generated that may affect the performance and reliability of these devices. Therefore, separate heat dissipating devices may be subsequently required that are both expensive and time consuming to attach during manufacturing. Further, complex IC chips require correspondingly increasing numbers of electrical interconnections due to their increased functionality. Consequently, high density interconnect package assemblies and the trend toward miniaturization have been principal objectives of semiconductor manufacturers. To this end, there have been semiconductor packages that have been developed with these objectives in mind.

One such example is a Ball Lead Integrated Package (BLIP) that combines ball and lead technologies to achieve high interconnect density (connectability) with a relatively small footprint. Such a device is fully described in the inventors' co-pending application Ser. No. 08/307,270, entitled: "High Density Integrated Circuit Assembly Combining Leadframe Leads With Conductive Traces" filed Sep. 16, 1994 which is incorporated herein by reference in its entirety.

FIG. 1 shows a cross section of a high density BLIP package, generally referred to by reference number 10. The package includes an IC die 12 mounted on a dielectric substrate 14 having a top surface 16 and a bottom surface 18. The package 10 attains high electrical interconnect density through the use of leads 20 and a multiplicity of solder balls 22 attached to the bottom surface 18 of the substrate 14 in the pattern of a grid array. The leads 20 are supported by the top surface of the substrate 14 and attached by way of insulative tape or non-conductive epoxy 24. Both the leads 20 and solder balls 22 serve to provide electrical interconnectivity to the outside world. This is accomplished by coupling die 12 to leads 20 and to conductive traces 28 simultaneously with bonding wires 26. Conductive traces 20 are routed on and through the substrate 14 by way of vias 29, or around the edges for connection with the solder balls 22. A plastic material is molded, in cooperation with the substrate 14, to encapsulate the device and to protect it from the outside environment.

One major disadvantage of the BLIP package is that it is inherently ineffective in removing heat generated internally by the die. The limited thermal performance of the BLIP package therefore may preclude its use for relatively high power/high speed devices. Since the BLIP was proposed as a high density package, the ability to package high heat generating devices without increasing the package size would be very useful. As will be described hereinafter, the present invention provides for a packaging arrangement for the BLIP having high interconnection density with heat extraction capabilities.

SUMMARY OF THE INVENTION

To achieve the foregoing and other objectives and in accordance with purpose of the present invention, an integrated circuit assembly is disclosed herein. In a first embodiment of the present invention, the integrated circuit assembly includes a dielectric substrate with top and bottom surfaces and a group of conductive traces that are disposed at least on the top surface. A group of leads are supported and attached to the top surface of the substrate and are themselves electrically isolated from the conductive traces. An integrated circuit die having a plurality of bond pads is affixed to the substrate. A first group of bonding wires electrically couple associated bond pads on the die to the conductive traces and a second group of bonding wires couple other associated bond pads to the leads. A molding material cooperates with the substrate to seal the die, conductive traces, and inner portions of the leads from the outside environment. A heat sink is engaged with the top surface of the die and integrated into the molding material. The heat sink may be exposed to the ambient environment to facilitate the removal of heat generated by the die. A plurality of solder balls, which are in electrical communication with the conductive traces, are attached to the bottom surface of the substrate.

A method of dissipating heat from an integrated circuit package in accordance to a first embodiment is also described. A heat sink is attached to the top surface of an integrated circuit die in a Ball Lead Integrated Package (BLIP). The BLIP includes a substrate having a top surface with a die is affixed thereon. The substrate has a plurality of conductive traces integrated therein and a plurality of solder balls attached to the bottom surface. An encapsulating material is molded over the heat sink and the substrate assembly such that the heat sink extends through the molding and may be exposed to the ambient environment, thereby conducting heat away from the die.

These and other advantages of the present invention will become apparent upon reading the following detailed descriptions and studying the various figures of the drawings.

BRIEF DESCRIPTION OF THE DRAWINGS

The invention, together with advantages thereof, may best be understood by reference to the following description taken in conjunction with the accompanying drawings in which.

DETAILED DESCRIPTION OF THE PREFERRED EMBODIMENTS

Figure 1:
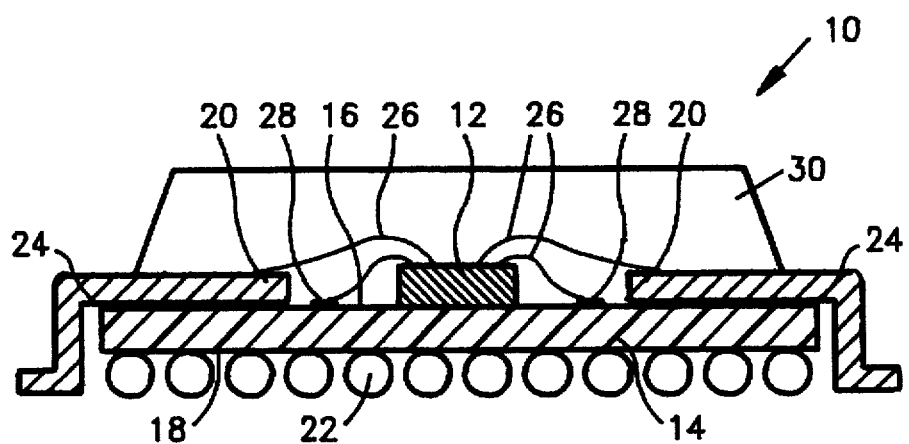
FIG. 1 is a diagrammatic cross sectional view of a Ball Lead Integrated Package.
Figure 2:
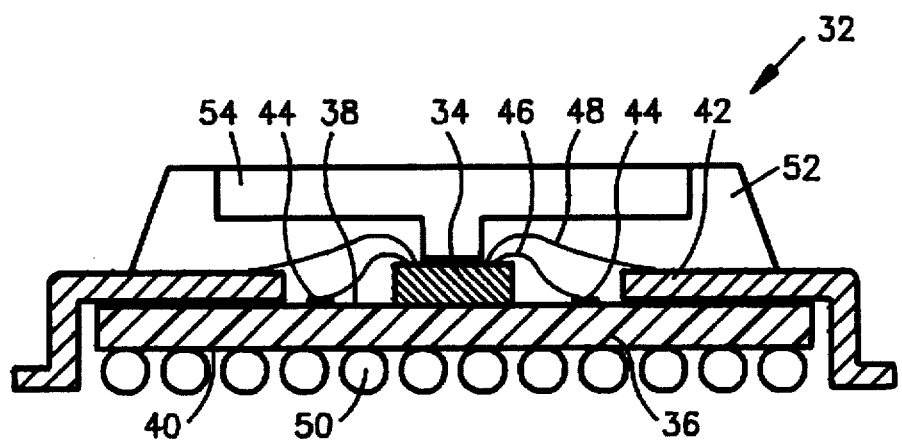
FIG. 2 is a diagrammatic cross sectional view of a Thermal Ball Lead Integrated Package in accordance with a first embodiment of the present invention.

A discussion of FIG. 1 directed towards an IC package was provided in the preceding sections. Attention is now directed to a Thermal BLIP which will address the thermal aspects of the BLIP package. Referring now to FIG. 2, there is shown a Thermal Ball Lead Integrated Package (Thermal BLIP) which is generally designated by reference numeral 32, in accordance with an embodiment of the present invention is shown and described. The Thermal BLIP includes an IC die 34 mounted on a dielectric substrate 36 having a top surface 38 and a bottom surface 40. A multiplicity of leads 42 are attached to and supported by the top surface 38, in conjunction with a series of conductive traces 44, and serve to provide the die 34 with a myriad of electrical interconnects for connection with external components. A first group of bonding wires 46 is used to couple associated bond pads on die 34 to the conductive traces 44, while simultaneously, a second group of bonding wires 48 couple other associated bond pads to the leads 42. This two-tiered wiring arrangement is the basis for the high interconnect density of the BLIP package. A plurality of solder balls 50 are attached to the bottom surface 40 of substrate 36 and are electrically connected to associated conductive traces 44. A molding material 52, in cooperation with the top surface of substrate 38, encapsulates die 34, inner portion of leads 42, and conductive traces 44 for protection from external environment. In accordance with the present invention, a heat sink 54 integrated in molding material 52 is attached to the top surface of the die and extends through the molding 52 where it is exposed to the ambient environment for removing internally generated heat.

Figure 3:
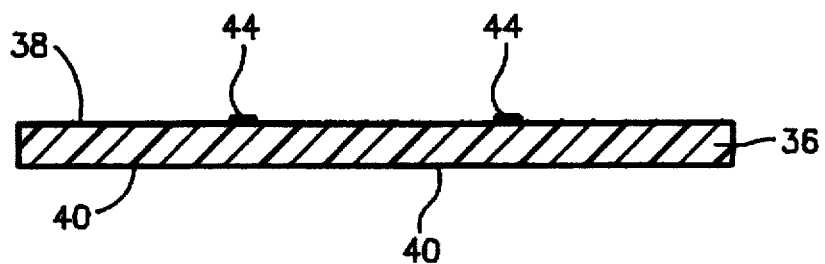
FIG. 3 is a diagrammatic cross sectional view of a dielectric substrate conductive traces of that shown in FIG. 2.

FIG. 3 illustrates a dielectric substrate 36 used in the embodiment of FIG. 2 for the present invention. The substrate 36 has two substantially parallel opposing surfaces 38 and 40 that correspond to top and bottom surfaces respectively. The substrate may be made of any dielectric material such as silicon, aluminum oxide or FR4. The substrate itself is non-conducting but has conductive traces 44 integrated into its structure which are designed provide electrical connections between the top and bottom surfaces. This is often accomplished by way of vias (not shown) that run through, or by the traces extending around the edges of the substrate 36.

Figure 4:
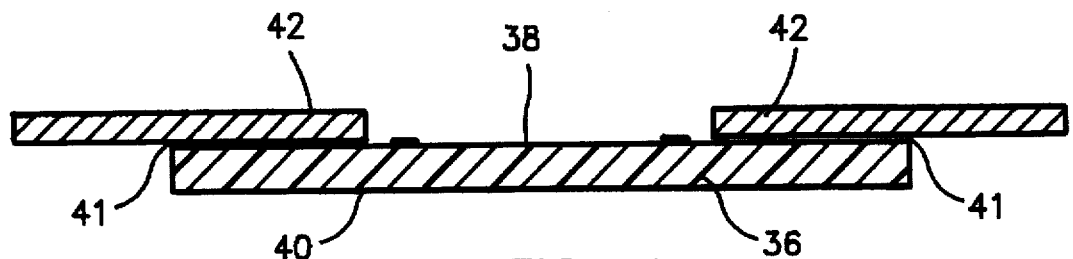
FIG. 4 is a diagrammatic cross sectional view of the substrate in FIG. 3 with leads attached.

Referring now to FIG. 4, a set of lead frame leads 42 have been attached to the substrate 36 of FIG. 3. The leads 42 are similar to those leads of a lead frame for a Quad Flat Pack, for example, without a die attach pad and are arranged to provide the die with a additional routing interconnects for communication with the outside world. This increases the interconnect density for coupling one or more integrated circuit die with numerous input/output terminals, as described in the above incorporated BLIP reference. The bottom surface of leads 42 are secured to the top surface 38 of substrate 36 with an adhesive material 41 such as non-conductive epoxy or double-sided insulative tape.

Figure 5:
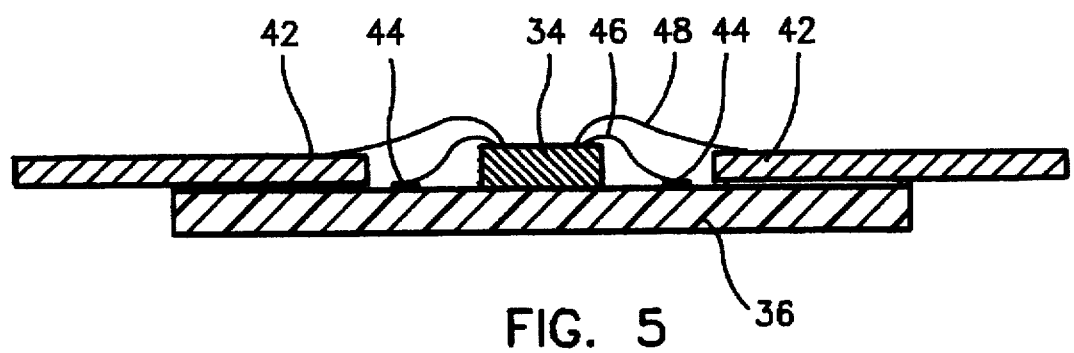
FIG. 5 is a diagrammatic cross sectional view of the structure in FIG. 4 with a die attached and wire bonded to the leads and conductive traces.

FIG. 5 illustrates the structure in FIG. 4 with a die 34 attached to the substrate 36 and bonded to interconnects which comprise leads 42 and conductive traces 44. A conventional adhesive, used in the semiconductor industry, is used to attach die 34 to substrate 36. A first set of bonding wires 46 are bonded from associated bond pads on the die to conductive traces 44 which complete the first tier of interconnections. A second set of bonding wires simultaneously bond associated bond pads to the leads 42 to complete the second tier. Both sets of bonding wires, which bond the leads 42 and conductive traces 44, are electrically isolated from each other to provide individual paths to the external environment.

Figure 6:
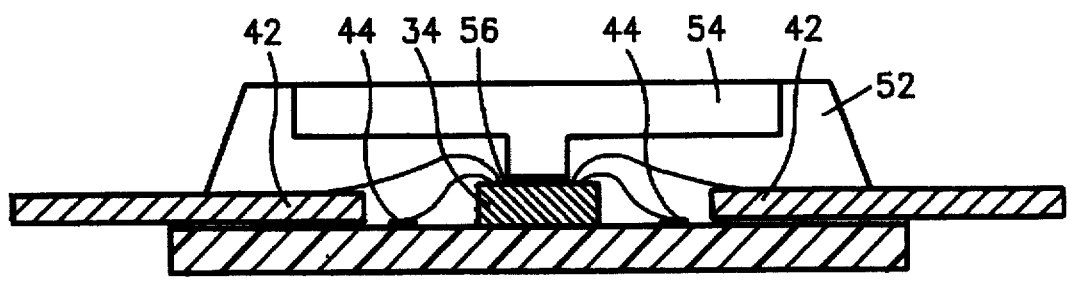
FIG. 6 is a diagrammatic cross sectional view of the structure in FIG. 5 encapsulated with a molding material and showing a heat sink integrated into the molding and exposed to the environment

Referring next to FIG. 6, the structure of FIG. 5 has been encapsulated with molding material 52. A heat sink 54 has been integrated into the molding material and attached at one end to the top surface of die 34. Attachment to the die is made through the use of a non-conductive epoxy 56 that is not electrically but is thermally conductive, although attachment is not necessary as long as the heat sink 54 is sufficiently engaged with the die surface such that heat transfer can occur. The epoxy, in addition to adhesion, possesses high thermal conductivity which serves to enhance the transfer of heat from die 34 to the heat sink 54. The heat sink 54 may be constructed from a variety of thermally conductive materials such as copper or aluminum. In the preferred embodiment, copper is used because of its relatively high thermal conductivity and low cost. The heat sink used in the Thermal BLIP of FIG. 6, may be of any suitable shape as long as the design sufficiently clears the bonding wires when attached.

In general, the larger the heat sink the more heat it is capable of removing since the surface area of the heat sink is proportional to the heat transfer rate. Therefore its configuration should be taken into account for a particular application. The next step is to mold over the structure with a molding material 52 such that the die, inner portions of the leads 42, conductive traces 44 are sealed from the outside environment. The molding material may be of any suitable encapsulating material used in the semiconductor industry such as ceramics, epoxies, and polymides. Plastic works well as an encapsulant and is used in the present invention since it can be cost effectively applied by injection molding. In the preferred embodiment, the heat sink 54 is exposed through molding 52 to the ambient environment to expedite heat removal but it should be understood that an exposed heat sink is not an absolute requirement.

Figure 7:
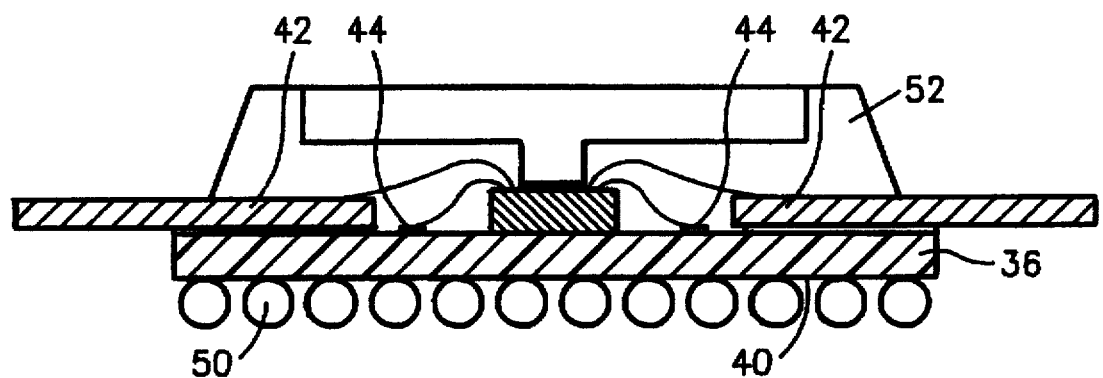
FIG. 7 is a diagrammatic cross sectional view of the structure in FIG. 6 with solder balls attached to the substrate.

FIG. 7 shows solder balls 50 attached to the bottom surface 40 of the structure of FIG. 6. As mentioned earlier, the solder balls 50 are electrically connected to the conductive traces 44 by way of vias (not shown) that go through the substrate or by traces extending around the edge of substrate 36. Therefore each conductive trace 44 is electrically isolated from each other and the leads 42 and are connected by a via or substrate edge to an associated solder ball 50. The solder balls 50 are formed in a dense pattern of a grid array along the bottom surface 40 which are arranged to be received on a circuit board having corresponding electrical contacts, for example. This enables the BLIP package to achieve a relatively small footprint. Finally the outer portion of leads 42 are formed into the desired form configuration such as a gull wing, as best seen in FIG. 2, for surface mount applications.

The Thermal BLIP adds effective heat sinking capability to the BLIP package thus providing a package with increased interconnect density with improved thermal performance. That is, the package density is not altered due to the presence of the heat sink, since the heat sink is integrated into the molding. Therefore, the cumbersome, space intensive heat sinks used in the past are no longer needed. Further, Thermal BLIPs permit the use of high power/speed devices to be incorporated without increasing the package size, and therefore, making them well suited for high density circuit board applications.

While the invention has been described primarily in terms of a Ball Lead Integrated package, it should be understood that the invention may be applied to other types of packages as well, such as, Quad Flat Packs, Ball Grid Arrays (BGAs), and assemblies containing substrates. Further while only one embodiment of the present invention has been described in detail, it should be understood that the present invention may be embodied in other specific forms without departing from the spirit or scope of the invention. Particularly, heat sinks that may engaged but not attached to the die or heat sinks that are not externally exposed. The integrated heat sink concept may have applications other than for use in single die packages, for example, in applications where the multiple die are supported in a single package, as described in the Ser. No. 08/307,270 co-pending application mentioned earlier. Therefore, the present examples are to be considered as illustrative and not restrictive, and the invention is not to be limited to the details given herein, but may be modified within the scope of the appended claims.

What is claimed is:

1. An integrated circuit assembly, comprising:
   (a) a dielectric substrate having a top surface and a bottom surface, said top surface having a plurality of electrically conductive traces formed thereon, and said bottom surface of said substrate includes a plurality of contacts attached thereto such that said associated conductive traces on the top surface are in electrical communication with associated ones of the contacts;
   (b) leads of a lead frame including a plurality of leads of separate and distinct electrically conductive leads, said leads supported by the top surface of said substrate;
   (c) an integrated circuit die having a top surface, said die including a first and second group of bond pads and wherein the die is affixed to said top surface of the substrate;
   (d) a first group of bonding wires electrically coupling said first group of said bond pads on the die to said conductive traces on said substrate, a second group of bonding wires electrically coupling said second group of said bond pads of the die to said leads;
   (e) a molding material molded over said top surface of the substrate, a part of the die including the bond pads, the bonding wires, and a first portion of the leads such that the molding material and the top surface of the substrate cooperate to seal most of the die from the ambient environment; and
   (f) a heat sink integrated within said molding material, said heat sink having a first end and a second end, said first end engaging against the top surface of the die and said second end being positioned away from the top surface of the die, said heat sink including a base portion that includes said first end and a heat dissipating portion that includes said second end, said base portion supporting said heat dissipating portion at a fixed distance from the upper surface of the substrate, said heat dissipating portion extending laterally outward from the base portion so that all of the bond pads, all of the bonding wires and at least a second portion of the leads are positioned directly between the heat dissipating portion and the substrate.

2. An integrated circuit assembly according to claim 1 wherein said bottom surface of said substrate further includes a plurality of solder balls attached thereto such that said associated conductive traces on the top surface are in electrical communication with the associated solder balls.

3. An integrated circuit assembly according to claim 1 wherein said second end of the heat sink is exposed through the molding material to the ambient environment.

4. An integrated circuit assembly according to claim 2 wherein said solder balls are attached to the bottom surface of the substrate in the form of a Ball Grid Array.

5. An integrated circuit assembly according to claim 1 wherein said package is a Ball Lead Integrated Package.

6. An integrated circuit assembly according to claim 1 wherein said heat sink includes any one of copper and aluminum.

7. An integrated circuit assembly according to claim 1 wherein the molding material is plastic.

8. A method of dissipating heat from an integrated circuit package having an integrated circuit die in a Ball Lead Integrated Package (BLIP), said BLIP including a substrate assembly which includes a substrate having a top surface and a bottom surface, said die affixed to the top surface, a plurality of conductive traces disposed on the substrate, and a plurality of solder balls attached to the bottom surface of the substrate in a predetermined pattern, the method comprising the steps of:

attaching a heat sink directly to the top surface of said substrate; and molding a material molded over the heat sink and the substrate assembly wherein the heat sink extends through the molding away from the substrate assembly such that heat is conducted away from the die by the heat sink.

9. A method of dissipating heat from an integrated circuit package according to claim 8 wherein the heat sink is exposed to the ambient environment.

10. An integrated circuit assembly according to claim 1 wherein said base portion defines a first cross-sectional shape which is substantially constant along said fixed distance.

11. An integrated circuit assembly according to claim 10 wherein said heat dissipating portion includes a thickness and defines a second cross-sectional shape which is substantially constant along said thickness.

* * * * *